United States Patent [19]

Marrah et al.

[11] Patent Number: 5,028,893
[45] Date of Patent: Jul. 2, 1991

[54] SWITCHED CAPACITOR FILTERS WITH CONTINUOUS TIME CONTROL

[75] Inventors: Jeffrey J. Marrah; Gregory J. Manlove, both of Kokomo; Richard A. Kennedy, Russiaville, all of Ind.

[73] Assignee: Delco Electronics Corporation, Kokomo, Ind.

[21] Appl. No.: 496,744

[22] Filed: Mar. 21, 1990

[51] Int. Cl.$^5$ ............................................. H03H 7/00
[52] U.S. Cl. .................................. 333/173; 333/81 R; 330/51
[58] Field of Search .................. 333/173, 81 R; 330/9, 330/51, 107, 109, 144, 284; 381/94, 120

[56] References Cited

U.S. PATENT DOCUMENTS

| | | | |
|---|---|---|---|
| 4,468,749 | 8/1984 | Kato et al. | 307/520 X |
| 4,634,997 | 1/1987 | Tompsett et al. | 330/284 |
| 4,721,923 | 1/1988 | Bares et al. | 330/284 |
| 4,866,779 | 9/1989 | Kennedy et al. | 333/173 X |

FOREIGN PATENT DOCUMENTS 0299406 12/1988 Japan .

Primary Examiner—Eugene R. LaRoche
Assistant Examiner—Seung Ham
Attorney, Agent, or Firm—Albert F. Duke

[57] ABSTRACT

An ajustable switched capacitor circuit comprises a first stage, a second stage and a switched capacitor circuit coupling the output of the first stage to the input of the second stage. The operating parameters of the second stage are a function of the effective resistance of the switched capacitor coupling circuit. An attenuator interposed between the output of the first stage and the input of the switched capacitor coupling circuit controls the charging voltage of the switched capacitor coupler thereby controlling its effective resistance and parameters of the output stage. The signal loss through the attenuator is continuously adjustable responsive to an external control voltage to obtain continuous control of various output stage parameters. The output stage may comprise a filter having the parameters of its transfer function determined by the effective resistance of the switched capacitor coupling circuit.

17 Claims, 7 Drawing Sheets

SWITCHED CAPACITOR FILTERS WITH CONTINUOUS TIME CONTROL

FIELD OF THE INVENTION

This invention relates to filter circuits and more particularly to integrated circuit filters having adjustable parameters.

BACKGROUND OF THE INVENTION

Switched capacitor circuits and operational amplifiers are widely used in both fixed and adjustable filters. Such switched capacitor type filters generally rely upon the effective resistance of a switched capacitor circuit to set filter coefficients. As is well known in the art, the effective resistance of a switched capacitor circuit is determined by the value of the capacitor and the frequency of the clock signals controlling the associated switches.

In filter applications of switched capacitor circuits, the frequency of the circuit clock signals is generally constrained to be substantially higher than the frequency of the signals processed by the filter. When switched capacitor filters employ more than one clock frequency, the higher frequency clock rate must be a integral multiple of the lower clock rate. Accordingly, varying the filter clocking frequency is generally not a practical means of adjusting filter parameters.

Some prior art circuits have employed banks of capacitors and switches to vary the capacitance of a switched capacitor in steps. Such arrangements require a very large number of steps to keep the quantizing noise induced by switching within acceptable limits. Furthermore, the digital control circuits for effecting the required switching are complex, and large numbers of capacitors in an integrated circuit switched capacitor filter make very inefficient use of chip area. The variation of capacitance by stepped increases or through changes in clock frequency allow only discrete step variations. It is preferred in many filter applications that the capacitance and the resulting effective resistance variations be continuously adjustable.

SUMMARY OF THE INVENTION

The invention is directed to circuit comprising a switched capacitor coupler exhibiting a prescribed effective resistance in which an input signal is coupled to the switched capacitor coupler. The magnitude of input signal applied to the switched capacitor coupler is varied to determine the exhibited effective resistance of the switched capacitor coupler.

According to one aspect of the invention, the magnitude of the input signal is continuously varied.

According to another aspect of the invention, an input signal is coupled to a filter by a switched capacitor coupler exhibiting a prescribed effective resistance. The magnitude of input signal applied to the switched capacitor coupler is varied to determine the exhibited effective resistance of the switched capacitor coupler and thereby vary the parameters of the filter.

In an embodiment illustrative of the invention, a filter circuit comprises a summing circuit, an integrator and a switched capacitor arrangement coupling the summing circuit and the integrator. An input signal is applied to the summing circuit and the output therefrom is supplied to the integrator through the switched capacitor coupler. The switched capacitor coupler operates as an effective resistance for the integrator to control one or more parameters of the filter circuit. A voltage controlled attenuator interposed between the output of the summing circuit and the switched capacitor coupler determines the effective resistance. The voltage controlled attenuator provides a controlled reduced replica of the summing circuit output which sets the charging voltage for the switched capacitor coupler in accordance with a control source. The effective resistance of the switched capacitor coupler and the filter parameters are thereby made continuously adjustable.

The invention will be better understood from the following more detailed description taken with the accompanying drawings and claims.

DETAILED DESCRIPTION

Figure 1:
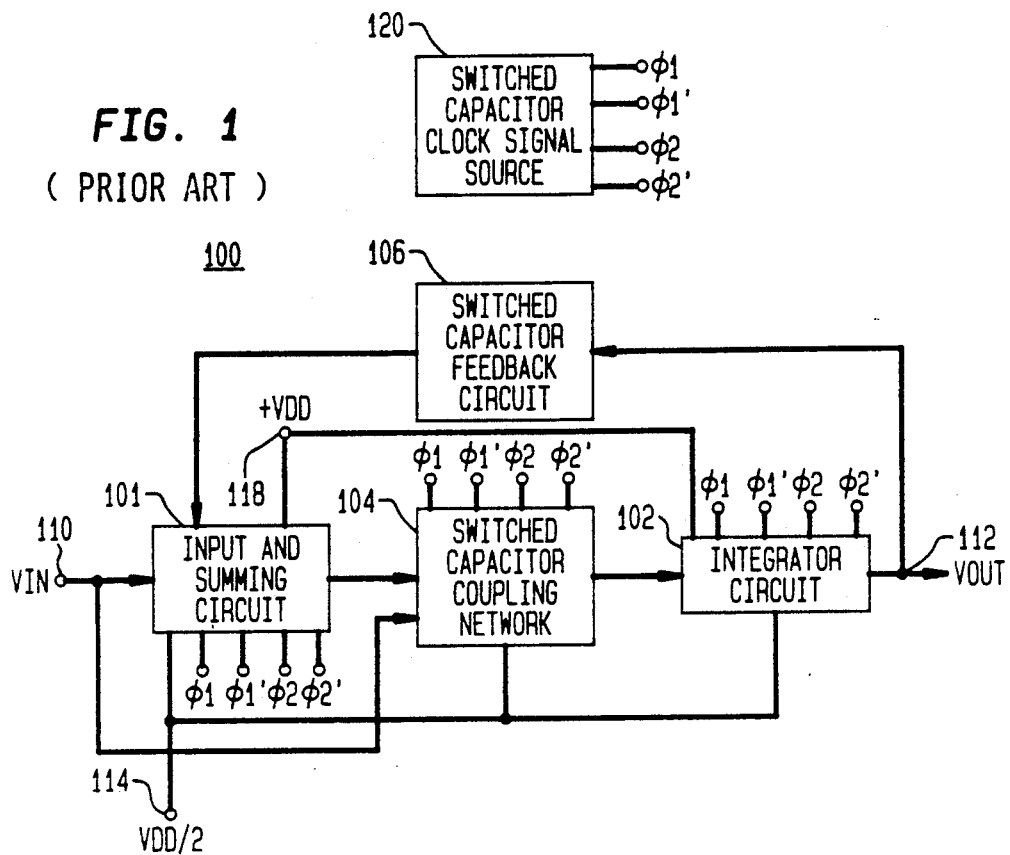
FIG. 1 is a block diagram of a prior art switched capacitor filter.

Referring now to FIG. 1, there is shown a block diagram of a prior art generalized switched capacitor filter 100. The filter 100 comprises an input terminal 110, an input and summing circuit 101, a switched capacitor coupling network 104, integrator circuit 102, switched capacitor feedback circuit 106, output terminal 112, voltage source terminals 114 and 118 and switched capacitor clock signal source 120 which generates output clock signals $\phi1$, $\phi1'$ (the complement of $\phi1$), $\phi2$ and $\phi2'$ (the complement of $\phi2$). Input and summing circuit 101 may comprise an operational amplifier in combination with switched capacitor elements well known in the art. Supply voltages +VDD/2 and +VDD, when applied to terminals 114 and 118, respectively, supply power to the input and summing circuit 101. Integrator circuit 102 may include an operational amplifier (not shown) and associated coupling elements (not shown). Switched capacitor coupling network 104 and switched capacitor feedback circuit 106 may each comprise arrangements of switched capacitor and capacitor elements adapted to determine the forward coupling and feedback transfer functions of the filter 100.

An input signal VIN applied to terminal 110 of FIG. 1 is applied to an input of the input and summing circuit 101 and is combined therein with signals fed back from integrator circuit 102 via switched capacitor feedback circuit 106. Terminal 110 is also coupled to another input of switched capacitor coupling network 104.

Switched capacitor coupling network 104 couples the output of input and summing circuit 101 to integrator circuit 102. The arrangement of switched capacitor elements within coupling network 104 and integrator circuit 102 and in switched capacitor feedback circuit 106 determine the transfer characteristic of the filter circuit 100. The general form of filter 100 is useful to construct low pass filters, band pass filters, notch filters, etc. by various configuration of the switched capacitors and other elements. The transfer characteristics of the switched capacitor filter 100 may be made fixed or adjustable.

Figure 8:
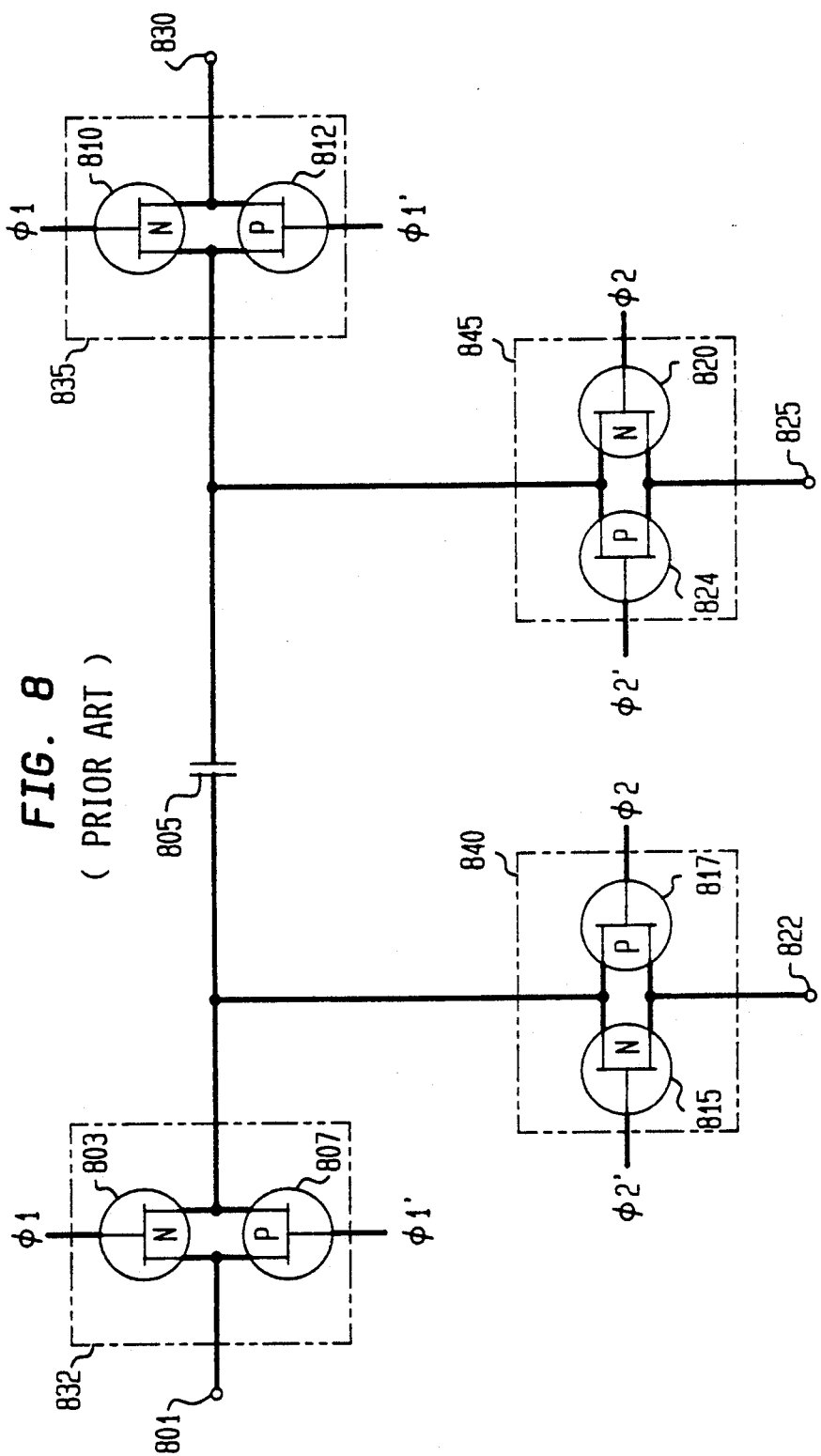
FIG. 8 is a schematic diagram of a switched capacitor circuit used in the embodiments of the present invention shown in FIGS. 3 and 4.

Referring now to FIG. 8, there is shown a prior art switched-capacitor element that is illustrative of the principles of its operation. As is well known in the art, a switched capacitor may simulate a resistance by transferring packets of charge from one circuit terminal, e.g. 801, to another, e.g. 830. The switched capacitor arrangement in FIG. 8 comprises capacitor 805 and bidirectional transmission gates 832, 835, 840 and 845. Each bidirectional transmission gates are essentially identical. Transmission gate 832 comprises an n-channel field effect transistor 803 and a p-channel field effect transistor 807 which passes current under control of a repetitive clock signal. The drain of transistor 803 is connected to the source of transistor 807 and the source of MOS transistor 803 is connected to the drain of transistor 807. A clock signal $\phi1$ is applied to the gate of transistor 803 at the same time the complement of clock signal $\phi1$, $\phi1'$, is applied to the gate of transistor 807. Both transistors 803 and 807 are switched to their on states responsive to the clock signals applied to their respective gates so that a bidirectional current path is formed. Bidirectional transmission gate 835 comprises n-channel field effect 810 and p-channel field effect transistor 812. The bidirectional transmission gates 832 and 835 are closed (low impedance paths) at the same time responsive to the $\phi1$ clock signals applied thereto to complete the current path from terminal 801 to terminal 830. Bidirectional gate 840 comprises n-channel field effect transistor 815 and p-channel field effect transistor 817 between terminal 822 and one side of capacitor 805. Similarly, bidirectional transmission gate 845 comprises n-channel field effect transistor 820 and p-channel field effect transistor 824 between terminal 825 and the other side of capacitor 805. Both bidirectional transmission gates 840 and 845 are controlled by clock signal $\phi2$ and its complement, $\phi2'$. Clock signals $\phi1$ and $\phi2$ are of opposite phase and are non-overlapping. When clock signal $\phi1$ causes bidirectional transmission gates 832 and 835 to conduct, clock signal $\phi2$ prevents conduction of bidirectional transmission gates 840 and 845. Similarly, when clock signal $\phi2$ activates bidirectional transmission gates 840 and 845, bidirectional transmission gates 832 and 835 are rendered non-conductive by clock signal $\phi1$. In the embodiments of the invention depicted in FIGS. 3 and 4, each bidirectional transmission gate described with respect to FIG. 8 is shown as a rectangle labeled T with input and output leads and a designated clock signal and its complement applied thereto.

In FIG. 8, capacitor 805 receives a charge packet corresponding to the voltage across terminals 22 and 825 while bidirectional transmission gates 840 and 845 conduct responsive to clock signal $\phi2$. Bidirectional transmission gates 832 and 835 are non-conducting at this time. In the time period when clock signal $\phi2$ is off and clock signal $\phi1$ is on, the capacitor 805 is discharged through bidirectional transmission gates 832 and 835 and the charging path through bidirectional transmission gates 840 and 845 is open. The process is repeated at a high rate relative to the frequency of the signal applied to terminal 801. As a result, the charge packets appear as a steady current. The current flow through bidirectional transmission gates 832 and 835, i.e. the charge transferred per unit time, is a function of the clock rate of signals $\phi1$ and $\phi2$, the size of capacitor 805, and the voltage applied between terminals 822 and 825. Consequently, the equivalent resistance of the switched capacitor arrangement in FIG. 8 is proportional to 1/fC where f is the clock frequency and C is the capacitance of capacitor 805.

External resistors may be used to vary the filter parameters of the fixed switched capacitor filter circuit 100 of FIG. 1 so that modifications to the switched capacitor arrangement are not required for such variations. But the use of external resistors precludes full integration of the filter and requires highly accurate resistor values. Changes of filter characteristics in a circuit such as the switched capacitor filter 100 in FIG. 1 may also be accomplished by varying capacitance, e.g., the capacitance of capacitor 805 in the switched capacitor element of FIG. 8. Additional capacitors can be placed in parallel across capacitor 805. This technique, however, only permits variation in discrete steps. The voltage across capacitor 805 may be changed by charging through an integrator with a fixed time constant through a programmed number of clock cycles. But, the number of clock cycles can only be varied in discrete steps. Neither of these methods nor adjustment of the clock rate of transmission gates illustrated in FIG. 8 allow continuous adjustment of filter characteristics. According to the invention, continuous adjustment is achieved by attenuating the signal applied to a switched capacitor coupling network and adjusting the attenuation so that the amount of charge in the capacitor of the switched capacitor coupler, e.g., coupling network 104 in FIG. 1, can be continuously adjusted in accordance with an external control signal.

Figure 2:
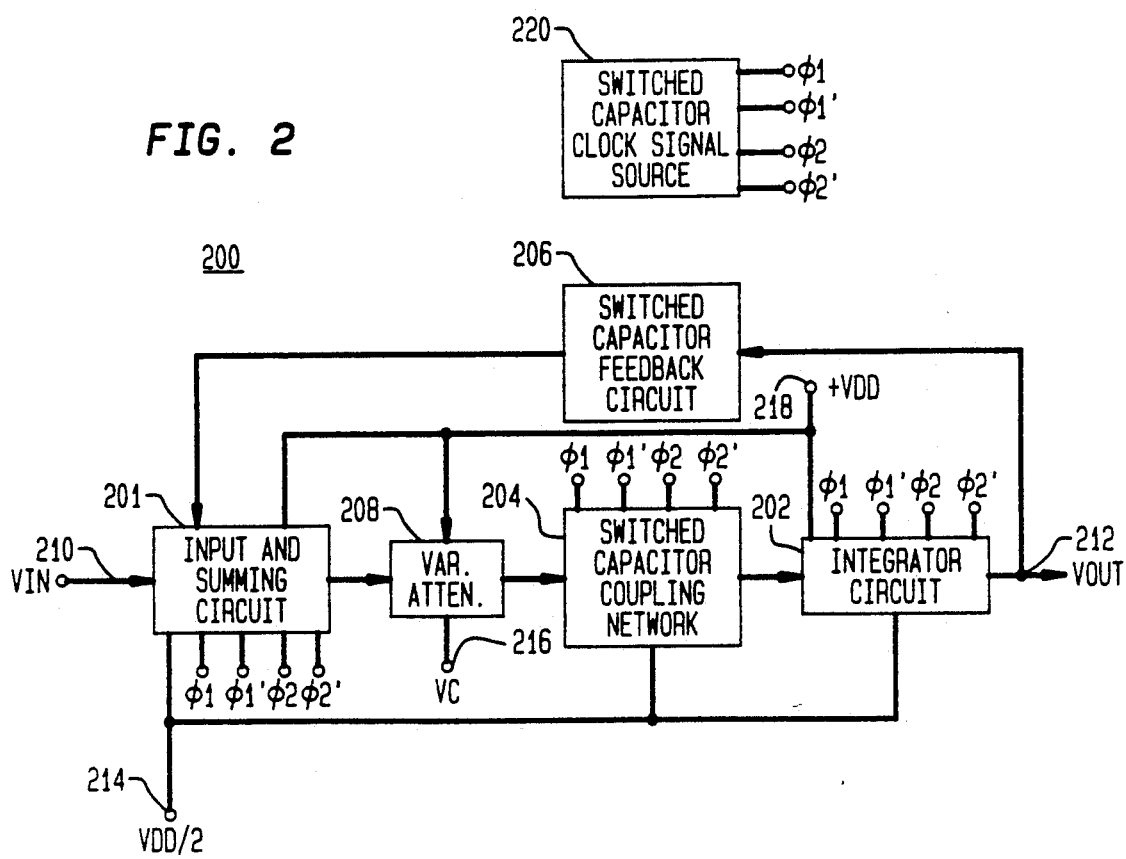
FIG. 2 is a block diagram of a switched capacitor filter in accordance an embodiment of the present invention.

Referring now to FIG. 2, there is shown a block diagram of an integrated circuit switched capacitor filter 200 in accordance with the present invention. The filter 200 comprises an input terminal 210, an input and summing circuit 201, a variable attenuator 208, a switched capacitor coupling network 204, an integrator circuit 202, a switched capacitor feedback circuit 206, an output terminal 212, voltage source terminals 214 and 218 and switched capacitor clock signal source 220 which generates output signals $\phi1$, $\phi1'$, $\phi2$ and $\phi2'$ which are coupled to inputs of the input and summing circuit 201, the network 204, the integrator circuit 202 and the network 206. Supply voltages +VDD/2 and +VDD applied to terminals 214 and 218, respectively, supply power to the input and summing circuit 201 and integrator circuit 202. Variable attenuator 208 receives a control signal VC from an input control terminal 216. Voltage VC is continuously adjustable and determines the attenuation parameters of variable attenuator 208. The input and summing circuit 201, the integrator circuit 202 and the switched capacitor coupling and feedback circuits 204 and 206 include switched capacitor elements and received switched capacitor clock signals $\phi1$ and $\phi2$ from clock signal source 220.

Input and summing circuit 201 may comprise an operational amplifier in combination with switched capacitor elements well known in the art. Integrator circuit 202 may include an operational amplifier and associated coupling elements. Variable attenuator 208 may be any attenuator well known in the art having its attenuation controlled by an external control signal. In the preferred embodiment of our invention, however, the arrangements disclosed in an application filed of even date herewith and entitled "Multiple Output Operational Amplifier" are employed in the summing circuit 201 and the variable attenuator 208. Switched capacitor coupling network 204 and switched capacitor feedback circuit 206 may each comprise arrangements of switched capacitor and capacitor elements adapted to determine the forward coupling and feedback transfer functions of the filter 200.

The operation of the filter 200 is similar to that described with respect to the filter 100 of FIG. 1 except that of the variable attenuator 208 is interposed between the input and summing circuit 201 and the switched capacitor coupling network 204. The input signal VIN from terminal 210 of FIG. 2 is applied to the input and summing circuit 201 and is combined therein with signals fed back from the integrator circuit 202 via the switched capacitor feedback circuit 206. The output of input and summing circuit 201 is supplied to switched capacitor coupling network 204 through variable attenuator 208. As will be described in greater detail with respect to the embodiments of the invention shown in FIGS. 3 and 4, the magnitude of the output signal from the variable attenuator 208 is determined by control voltage VC which is continuously adjustable. In this way, the filter 200 coefficients affected by the switched capacitor coupling network 204 may be continuously adjusted rather than adjustable only in discrete steps.

Switched capacitor coupling circuit 204 receives an output signal from the variable attenuator 208. As explained with respect to the switched capacitor element shown in FIG. 8, the voltage charging the capacitor in such a switched capacitor element determines its effective resistance. In this way, the effective resistance in switched capacitor coupling network 204 can be continuously adjusted. An output of switched capacitor coupling network 204 is coupled to an input of integrator circuit 202 which further determines the transfer function of the filter 200. A signal VOUT at the output of integrator 202 (a terminal 212) is fed back to the input and summing circuit 201 through switched capacitor feedback circuit 206 to further determine the transfer characteristic of filter 200 and to stabilize its operation. As stated with respect to filter 100 of FIG. 1, the general form of the switched capacitor filter 200 is useful to construct low pass filters, band pass filters, notch filters, etc. by various configurations of the switched capacitors and other elements. Additionally, the filter coefficients and the resultant transfer function can be continuously adjusted by means of control voltage VC and the operation of variable attenuator 208.

Figure 3:
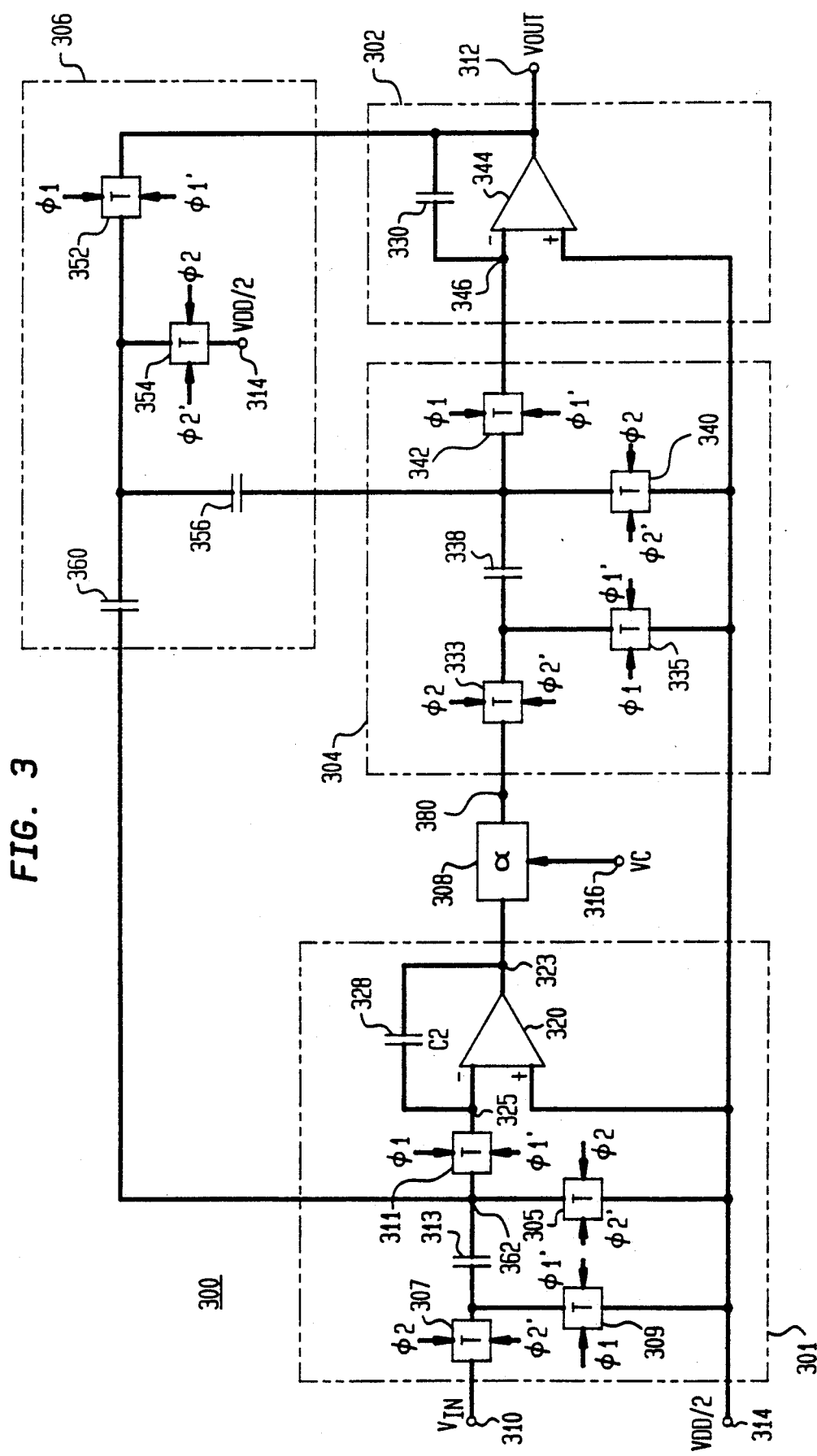
FIG. 3 is a schematic diagram of a switched capacitor low pass filter in accordance with another embodiment of the present invention.

Referring now to FIG. 3, there is shown a schematic diagram of a switched capacitor low pass filter 300 in accordance with the invention. The filter 300 comprises an input terminal 310, a summing circuit 301 (shown within a dashed line rectangle which corresponds to input and summing circuit 201 of FIG. 2), a variable attenuator 308 corresponding to attenuator 208 in FIG. 2, a switched capacitor coupling network 304 (shown within a dashed line rectangle corresponding to coupling network 204 in FIG. 2), an integrator 302 (shown within a dashed line rectangle corresponding to integrator 202 in FIG. 2) and a switched capacitor feedback circuit 306 (shown within a dashed line rectangle) comprising transmission gates 352 and 354 and capacitors 356 and 360. The summing circuit 301 comprises transmission gates 305, 307, 309 and 311, a capacitor 313, an operational amplifier 320 and a feedback capacitor 328. The switched capacitor coupling network 304 comprises transmission gates 333, 335, 340 and 342 and a capacitor 338. The integrator 302 comprises an operational amplifier 344 and a feedback capacitor 330.

In FIG. 3, input signal VIN from terminal 310 is applied to a negative (−) input terminal 325 of operational amplifier 320 through the switched capacitor arrangement of $\phi 1$ ($\phi 1'$) clocked transmission gates 309 and 311 and $\phi 2$ ($\phi 2'$) clocked transmission gates 305 and 307 and capacitor 313. Transmission gates 305 and 309 and a terminal 314 are connected to a voltage source having an output voltage of VDD/2. A positive input (+) of operational amplifier 320 is connected to a terminal 314. The output of integrator 302 is also applied to negative input 325 of operational amplifier 320 through $\phi 1$ clocked transmission gates 352 and 311 using $\phi 2$ clocked transmission gates 354 and 305.

Signal VIN from capacitor 313 is combined with signal fed back from operational amplifier 344 at a terminal 362 and at the negative input terminal 325 of operational amplifier 320. The output of operational amplifier 320 is supplied to switched capacitor coupling network 304 through variable attenuator 308. In prior art switched capacitor low pass filters, the output of operational amplifier 320 at terminal 323 is connected directly to the input of transmission gate 333 to provide a filter with a fixed center frequency and fixed Q. Prior art variable switched capacitor filters have employed switched banks of capacitors in parallel with capacitor 338 to vary the effective resistance of the switched capacitor coupling network and thereby control the center frequency and the Q of the filter.

Switched capacitor coupling circuit 304 receives the output of variable attenuator 308. As explained with respect to the switched capacitor element shown in FIG. 8, such a switched capacitor element functions as an effective resistance and the voltage charging the capacitor in determines this effective resistance. In this way, the effective resistance in switched capacitor coupling network 304 can be continuously adjusted responsive to control voltage VC. In filter 300 of FIG. 3, capacitor 338 is charged through $\phi 2$ clocked transmission gates 333 and 340 and discharged into the negative input of amplifier 344 at terminal 346 through $\phi 1$ clocked transmission gates 335 and 342. The voltage at a terminal 380 between attenuator 308 and transmission gate 333 is a replica of the signal from operational amplifier 320 at a terminal 323. The signal replica magnitude is a function of voltage VC at terminal 316. Thus, the charge packets on capacitor 338 and consequently the effective resistance of switched capacitor coupling circuit 304 varies in accordance with control voltage VC. The effective resistance of switched capacitor coupling network 304 controls the center operating frequency and the Q of the filter.

Figure 5:
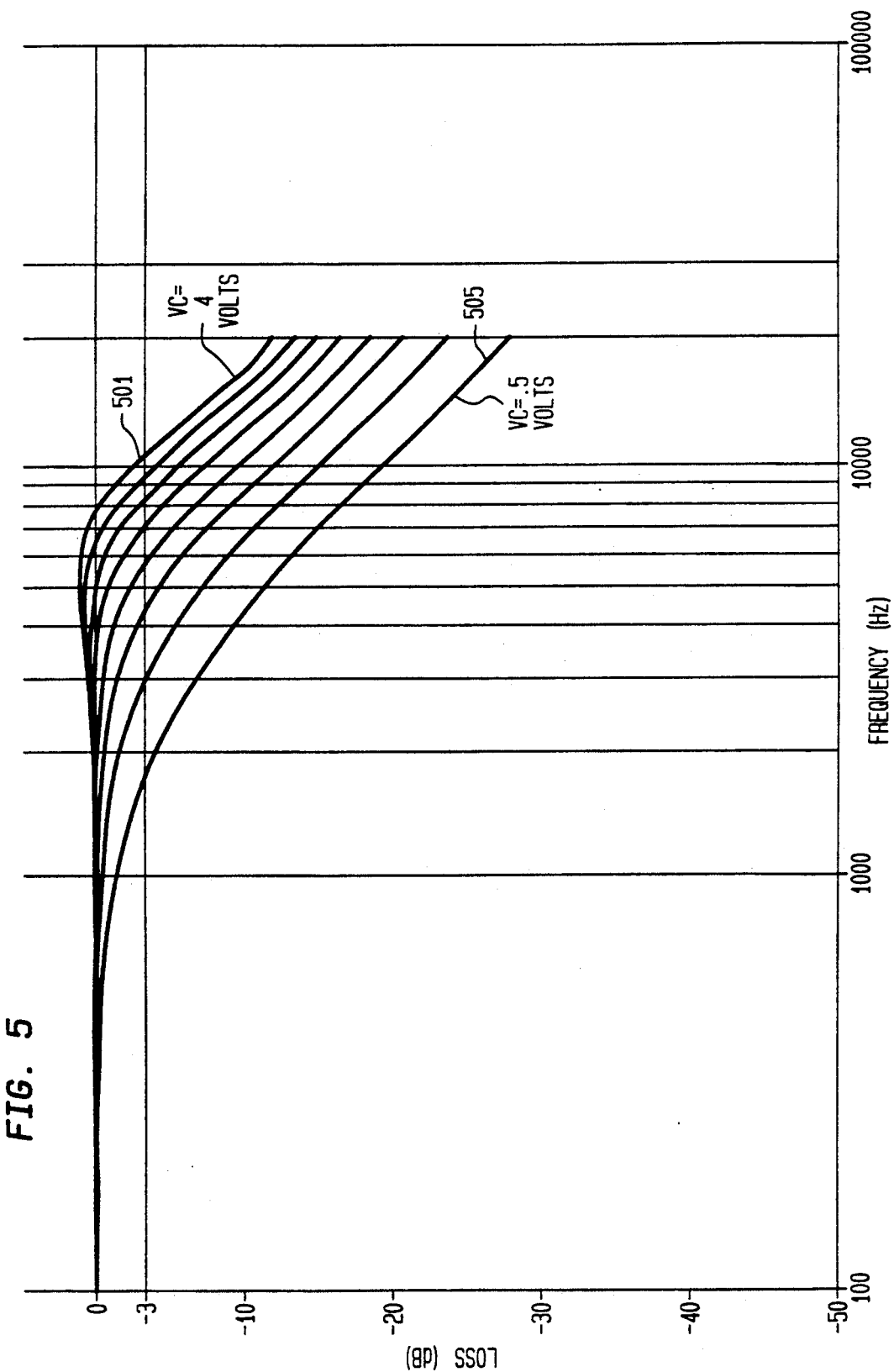
FIG. 5 is a response curve illustrative of the operation of the switched capacitor low pass filter embodiment of FIG. 3 under different control voltage conditions.

The filter circuit 300 is a continuously adjustable low-pass filter. The low-pass characteristics of the switched capacitor low pass filter 300 for eight (8) different control voltage conditions at VC terminal 314 of FIG. 3 are illustrated in FIG. 5. Referring now to FIG. 5, there is graphically shown the low-pass characteristics of filter 300 with Loss in db on the y-axis and frequency in Hz on the x-axis. A maximum voltage condition (e.g., 4 volts of VC at terminal 316 in switched capacitor low pass filter 300) results in maximum bandwidth curve (waveform 501) for the variable low-pass filter 300. A minimum voltage condition, 0.5 volt or less, at terminal 316 results in the minimum bandwidth curve (waveform 505) for the filter 300. As seen in FIG. 5, the output the low-pass filter 300 of FIG. 3 is down approximately 3 db at 10,000 Hz in the maximum bandwidth condition (waveform 501) and the output is down approximately 3 db at 1,800 Hz in the minimum bandwidth condition shown on waveform 505.

Referring again to FIG. 3, the output of the switched capacitor coupling network 304 is applied to the input of integrator circuit 302 which further determines the transfer function of filter 300. A signal VOUT from the output of integrator 302 at terminal 312 is fed back to input and summing circuit 301 to further determine the transfer characteristic of switched capacitor low pass filter 300 and to stabilize its operation. Negative feedback from the output of operational amplifier 344 to the inverting (negative) input thereof at a terminal 346 is provided by the switched capacitor arrangement of transmission gates 352, 354, 340 and 342 and capacitor 356 and feedback capacitor 330. Negative feedback from the output of amplifier 344 to the inverting input 325 of amplifier 320 is provided by the transmission gates 352, 354, 305 and 311 and capacitor 360. A variable attenuator such as the type employed as attenuator 308 may be used in place of the operational amplifier 344 whereby the effective resistance of the switched capacitor feedback network 306 may be varied to adjust the parameters of the feedback network in accordance with a control voltage similar to voltage VC.

The switched capacitor circuit 300 may be used in audio type systems where voltage VIN applied to terminal 310 is an audio signal. Switched capacitor clock signals ∅1 and ∅2 may, for example, be non-overlapping square wave signals which occur at a 45 kHz repetition rate and the transmission gates shown in FIG. 3 may be bidirectional transmission gates such as illustrated in FIG. 8. The voltage VDD/2 could be, for example, +4 volts. The output signal at terminal 312 is then the an audio signal VIN modified by the transfer function of filter 300 in FIG. 3 and centered about VDD/2.

The variable attenuator 308 can be any continuously adjustable voltage controlled attenuator. In preferred embodiment operational amplifier 320 and attenuator 308 together comprise a dual output amplifier as shown in FIG. 6 which is the subject of a pending application filed of even date herewith and entitled "Multiple Output Operational Amplifier".

Figure 6:
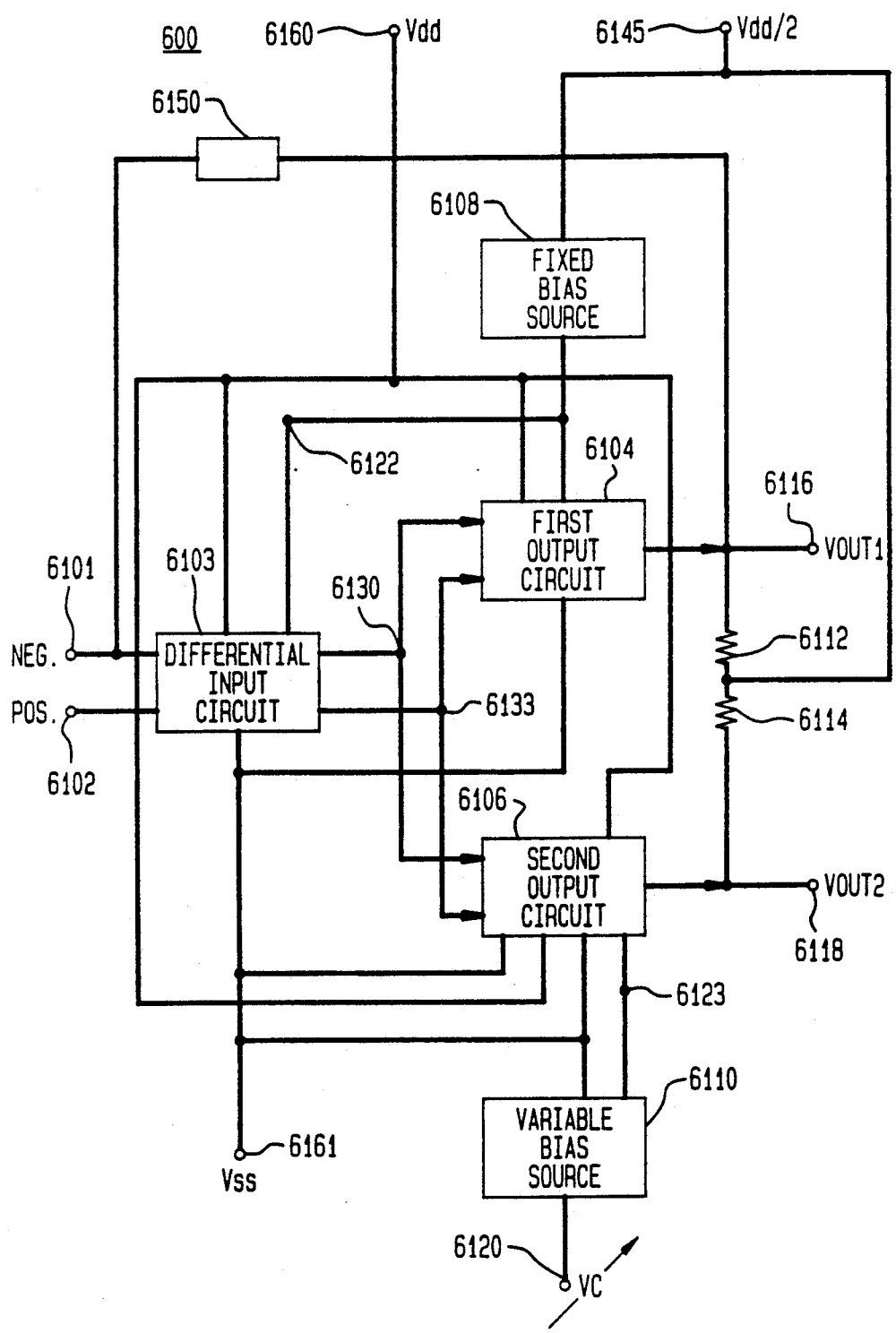
FIG. 6 is a block diagram of a dual output operational amplifier that is used in the embodiments of the present invention.

Referring now to FIG. 6, there is shown an amplifier 600 that may be used as summing circuit 301 and variable attenuator 308 in the low-pass filter 300 of FIG. 3. Amplifier 600 of FIG. 6 is the subject of another patent application which is being filed concurrently with the present patent application and in which there is a common assignee and the same inventors. Amplifier 600 comprises a differential input circuit 6103, a first output circuit 6104, a second output circuit 6106, a fixed bias source 6108, a variable bias source 6110, first and second load impedances 6112 and 6114 and a feedback element 6150. A first input terminal 6101 of amplifier 600 is coupled to a first input of differential input circuit 6103 and is shown coupled to an input signal POS. A second input terminal 6102 of amplifier 600 is coupled to a second input of differential input circuit 6103 and is shown coupled to an input signal NEG. Amplifier 600 generates a first output signal VOUT1 at a first output terminal 6116 of amplifier 600 which is coupled to an output of the first output circuit 6104, to a first terminal of load impedance 6112, and to a first terminal of feedback element 6150. Amplifier 600 generates a second output signal VOUT2 at a second output terminal 6118 of amplifier 600 which is coupled to an output of second output circuit 6106 and to a first terminal of load impedance 6114. First power supply terminals of the differential input circuit and the first and second output circuits 6104 and 6106 are coupled to a power supply Vdd and to a terminal 6160. Second terminals of load impedances 6112 and 6114 are coupled to a first power supply terminal of fixed bias source 6108, to a power supply Vdd/2 and to a terminal 6145. An input of variable bias source 6110 is coupled to a variable power supply VC (shown as VC with an arrow therethrough) and to a terminal 6120.

A first output terminal of differential input circuit 6103 is coupled to first inputs of first and second output circuits 6104 and 6106 and to a terminal 6130. A second output terminal of differential input circuit 6103 is coupled to second inputs of first and second output circuits 6104 and 6106 and to a terminal 6133. An output of fixed bias source 6108 is coupled to power supply inputs of first output circuit 6104 and differential input circuit 6103 and to terminal 6122. An output of variable bias source 6110 is coupled to a power supply input of second output circuit 6106 and to a terminal 6123. A second terminal of feed back element 6150 is coupled to terminal 6101.

Differential input circuit 6103 receives input signals NEG and POS from terminals 6101 and 6102, respectively, and forms an amplified signal corresponding to the difference between signals NEG and POS. The amplified differential signal appears across output terminals 6130 and 6133. The amplified signal from terminals 6130 and 6133 is applied to first output circuit 6104 and to second output circuit 6106. Signal VOUT1 is generated in the first output circuit 6104 and appears across load impedance 6112 between lead 6116 and terminal 6145. Terminal 6145 is effective as an A.C. ground. A separate output signal VOUT2 is obtained from the second output circuit 6106 and appears across load impedance 6114 between terminal 6118 and terminal 6145.

Each of output circuits 6104 and 6106 operates independently in response to the bias voltages applied thereto from bias sources 6108 and 6110, respectively. Signal VOUT1 and VOUT2 are amplified versions of the signal corresponding to the difference between signals POS and NEG. The magnitude of signal VOUT1 from output circuit 6104, which is controlled by fixed bias source 6108, is independent of the magnitude of signal VOUT2 from output circuit 6106, which is controlled by variable bias source 6110. The output of fixed bias source 6108 supplies a bias control voltage to differential input circuit 6103 and to first output circuit 6104. The gain of output circuit 6104 is maintained at a prescribed level determined by fixed bias source 6108. Variable (adjustable) bias source 6110, which controls the gain of second output circuit 6106, receives a control voltage from the power supply VC. Control voltage VC may be continuously adjusted so that the gain of second output circuit 6106 is adjustable. It is to be understood that additional output circuits substantially identical to second output circuit 6106 may be added to provide a plurality of output signals each controllable from a separate adjustable power supply like VC.

As is well known in the art, the gain of an operational amplifier is generally stabilized by providing a feedback path between its output and its input. Such a feedback path, however, interferes with any attempted adjustment of the gain by a bias source. As aforementioned, there are circuit applications in which a bias controlled variable signal from an operational amplifier is required as in a switched capacitor arrangement. In accordance with the invention, a bias controlled variable signal voltage is produced by an operational amplifier. The gain stability of the operational amplifier is assured by providing a feedback path between a fixed biased output stage and the input stage, while the gain of a variable biased output stage provides the needed bias controlled variable voltage. In amplifier circuit 600 of FIG. 6, feedback element 6150 is shown coupled between terminal 6116 at the output of the fixed biased first output circuit 6104 and input terminal 6101 so that the operation of amplifier 600 is stabilized. Other operational amplifier feedback arrangements well known in the art may also be employed. Second output circuit is controlled by voltage VC through adjustable bias source 6110 whereby its gain is continuously adjustable. In this way, a bias controlled variable voltage is produced by a gain stabilized operational amplifier. It is apparent that more variable bias controlled output circuits similar to second output circuit 6106 may be added to amplifier 600 as long as one fixed bias controlled circuit such as output circuit 6104 is used. The addition of a feedback path between the output of the first output circuit 6104 and the differential input circuit further assures gain stability.

Figure 7:
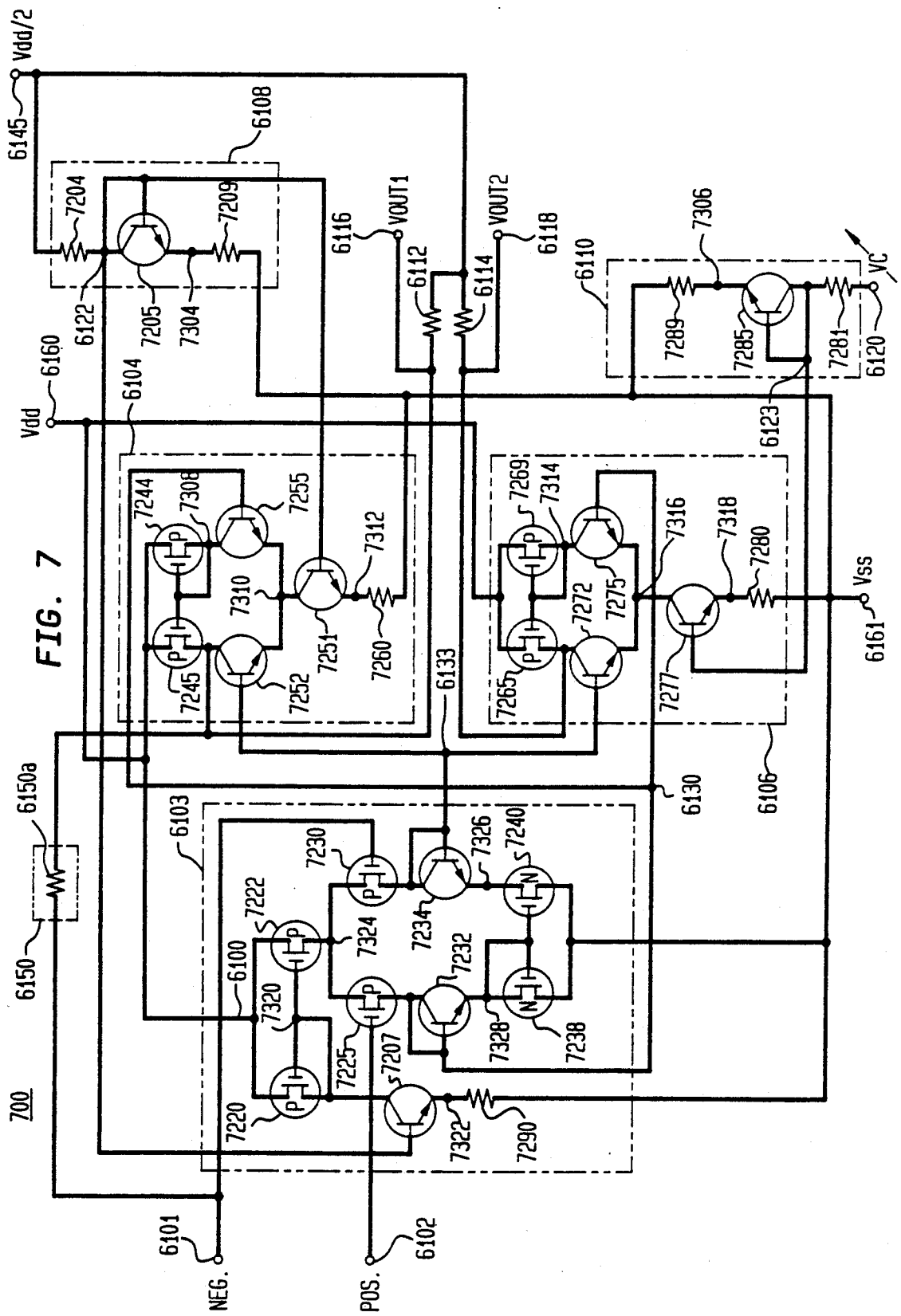
FIG. 7 is a schematic diagram of the dual output operational amplifier of FIG. 6.

Referring now to FIG. 7, there is shown a schematic diagram of an amplifier circuit 700 that may be used as operational amplifier 600 of FIG. 6 herein. Each of the block diagrams of FIG. 6 is shown as a corresponding dashed line rectangle in FIG. 7 with the same reference number used in FIGS. 6 and 7. Amplifier 600 of FIG. 6 is the subject of another patent application which is being filed concurrently with the present patent application and in which there is a common assignee and the same inventors. Each of the circuits of FIG. 7 comprises transistors and resistors coupled together to perform the needed function.

Fixed bias source 6108 comprises resistors 7204 and 7209 and an n-p-n bipolar transistor 7205. Variable bias source 6110 comprises resistors 7281 and 7289 and an n-p-n bipolar transistor 7285. Differential input amplifier 6103 comprises p-channel field effect transistors 7220, 7222, 7225 and 7230, n-channel field effect transistors 7238 and 7240, n-p-n bipolar transistors 7207, 7232 and 7234, and a resistor 7290. First output circuit 6104 comprises p-channel field effect transistors 7244 and 7245, n-p-n bipolar transistors 7251, 7252 and 7255 and a resistor 7260. Second output circuit 6106 comprises p-channel field effect transistors 7265 and 7269, n-p-n bipolar transistors 7272, 7275 and 7277, and a resistor 7280. In an illustrative embodiment, all of the field effect transistors (FET) are typically metal-oxide-semiconductor (MOS) transistors which may be denoted as MOSFETs. In a preferred embodiment the "metal", which is typically used for the gate, is polysilicon. Load impedances 6112 and 6114 are shown as resistors 6112 and 6114, respectively, and feedback element 6150 is shown as a resistor 6150a.

A first terminal of resistor 7204 and first terminals of resistors 6112 and 6114 are coupled to a power supply having a positive output voltage of Vdd/2 and to the terminal 6145. The sources of transistors 7220, 7222, 7244, 7245, 7265 and 7269 are coupled to a power supply having a positive output voltage of Vdd and to the terminal 6160. First terminals of resistors 7209, 7260, 7280, 7289 and 7290, and the sources of transistors 7238 and 7240 are coupled to a reference power supply having a voltage of Vss (typically ground) and to the terminal 6161. Input terminal 6101 is coupled to the gate of transistor 7230 and to a first terminal of feedback resistor 6150a. Input terminal 6102 is coupled to the gate of transistor 7225. Output terminal 6116 is coupled to a second terminal of resistor 6112, to the collector of transistor 7252, to the drain of transistor 7245 and to a second terminal of feedback resistor 6150a. Output terminal 6118 is coupled to a second terminal of resistor 6114, to the collector of transistor 7272 and to the drain of transistor 7265.

A second terminal of resistor 7204 is coupled to the collector and base of transistor 7205, to the bases of transistors 7207 and 7251 and to the terminal 6122. The emitter of transistor 7205 is coupled to a second terminal of the resistor 7209 and to a terminal 7304.

A first terminal of resistor 7281 is coupled to a terminal 6120 and to a power supply having a variable output voltage VC which is shown as VC with an arrow therethrough. A second terminal of resistor 7281 is coupled to the base and collector of transistor 7285, to the base of transistor 7277 and to the terminal 6123. The emitter of transistor 7285 is coupled to a second terminal of the resistor 7289 and to a terminal 7306.

The gates of transistors 7244 and 7245 are coupled to the drain of transistor 7244, to the collector of transistor 7255 and to a terminal 7308. The emitters of transistors 7252 and 7255 are coupled to the collector of transistor 7251 and to a terminal 7310. The emitter of transistor 7251 is coupled to a second terminal of resistor 7260 and to a terminal 7312. The bases of transistors 7232, 7255 and 7275 are coupled to the collector of transistor 7232, to the drain of transistor 7225 and to the terminal 6130. The bases of transistors 7234, 7252 and 7272 are coupled to the collector of transistor 7234, to the drain of transistor 7230 and to the terminal 6133.

The gate of transistor 7265 is coupled to the gate and drain of transistor 7269, to the collector of transistor 7275 and to a terminal 7314. The emitters of transistors 7272 and 7275 are coupled to the collector of transistor 7277 and to a terminal 7316. The emitter of transistor 7277 is coupled to a second terminal of resistor 7280 and to a terminal 7318.

The drain and gate of transistor 7220 are coupled to the collector of transistor 7207, to the gate of transistor 7222 and to a terminal 7320. The emitter of transistor 7207 is coupled to a second terminal of the resistor 7290 and to a terminal 7322. The drain of transistor 7222 is coupled to the sources of transistors 7225 and 7230 and to a terminal 7324. The emitter of transistor 7234 is coupled to the drain of transistor 7240 and to a terminal 7326. The emitter of transistor 7232 is coupled to the gate and drain of transistor 7238, to the gate of transistor 7240 and to a terminal 7328.

The fixed bias source 6108 of the amplifier 700 of FIG. 7 comprises a voltage divider arrangement connected between Vdd/2 (terminal 6145) and Vss (DC ground, terminal 6161). A preset voltage Vdd/2 applied to terminal 6145 causes a predetermined current to flow through the resistor 7204, the diode connected transistor 7205 and the resistor 7209. A preset voltage proportional to voltage Vdd/2 appears at the commonly connected base and collector (terminal 6122) of transistor 7205. This preset voltage is supplied to the bias arrangement (i.e., the base of transistor 7207) for source coupled transistors 7225 and 7230 of the differential input circuit 6103 of the amplifier 700 of FIG. 7 and to the emitter bias arrangement for emitter coupled transistors 7252 and 7255 of the first output circuit 6104 of the amplifier 700 of FIG. 7. As a result of the preset voltage Vdd/2 at terminal 6145, the gains of the differential input circuit 6103 and first output circuit 6104 portions of the amplifier in FIG. 7 are fixed.

The variable bias source 6110 of the amplifier of FIG. 7 comprises a voltage divider arrangement connected between control voltage terminal 6120 and Vss (typically DC ground). An adjustable control voltage VC applied to terminal 6120 controls the current flow through the resistor 7281, the diode connected transistor 7285 and the resistor 7289. A voltage proportional to the adjustable control voltage VC appears at the commonly connected base and collector (terminal 6123) of transistor 7285. This adjustable voltage is supplied to the bias arrangement of the output circuit 6106 of the amplifier 700 of FIG. 7 including emitter connected transistors 7272 and 7275. As a result of the adjustable voltage VC, the gain of the second output circuit portion of the amplifier in FIG. 7 may be continuously adjusted in response to the control voltage VC.

In the differential input circuit portion of the amplifier of FIG. 7, input signals POS and NEG are applied to the gates of transistors 7225 and 7230, respectively. Transistors 7225 and 7230 operate as a source connected pair to amplify the difference between signals NEG and POS. The current for the sources of transistors 7225 and 7230 is coupled from the base of transistor 7205 of the fixed bias source 6108 to source connected transistors 7225 and 7230 through source bias transistor 7207 and current mirror connected transistors 7220 and 7222. The voltage at the base of transistor 7207 is controlled by the voltage at the collector and the base of transistor 7205. Since the collector-base path of transistor 7207 is connected in series with the source-drain path of transistor 7220, the drain current through transistor 7220 and the drain current from transistor 7222 into terminal 7324 is fixed by the voltage VDD/2 at terminal 6145. Consequently, the current supplied to the commonly connected sources of transistors 7225 and 7230 from terminal 7324 is predetermined.

Diode connected transistors 7232 and 7234 and current mirror connected transistors 7238 and 7240 form an active load for the drains of transistors 7225 and 7230. The drain of transistor 7225 is connected to the drain and gate of transistor 7238 through the collector-emitter path of diode connected transistor 7232 while the drain of transistor 7230 is connected to the drain of transistor 7240 through the collector-emitter path of diode connected transistor 7234. The differential signal output of the input circuit 6103 of the amplifier 700 shown in FIG. 7 appears between the drains of transistors 7225 and 7230. The gain of the amplifier input circuit 6103 in FIG. 7 is determined by the source bias current which is in turn controlled by the base voltage of n-p-n source bias transistor 7207. Since this base voltage is fixed, the gain of the input circuit 6103 of FIG. 7 is preset at a constant value.

In the first output circuit 6104 of the amplifier 700 shown in FIG. 7, the base of n-p-n transistor 7252 is connected to the drain of transistor 7230 and the base of transistor 7255 is connected to the drain of transistor 7225. These bases receive the differential output signal from input circuit transistors 7225 and 7230. The emitters of n-p-n transistors 7252 and 7255 are connected together at terminal 7310 and to a bias arrangement comprising the transistor 7257 and the resistor 7260 connected between terminal 7310 and Vss. The base of transistor 7251 is connected to the base of transistor 7205 in the fixed bias circuit 6108 of FIG. 7. Consequently, the current through the collector-emitter path of transistor 7251 is controlled by the fixed voltage VDD/2 at terminal 6145. The gain of the first output circuit 6104 is thereby fixed with respect to the circuit bias as is the gain of input circuit 6103.

The load circuit for n-p-n transistors 7252 and 7255 includes current mirror connected transistors 7244 and 7245 whose sources receive fixed DC voltage Vdd from terminal 6160 and load resistor 6112 connected between terminal 6145 and the collector of n-p-n transistor 7252. Transistor 7252 also has its collector connected to the drain of transistor 7245 as well as to resistor 6112. Transistor 7255 has its collector connected to the gates of transistors 7244 and 7245 and to the drain of transistor 7244 via terminal 7308. Diode connected n-p-n transistors 7232 and 7234 of input circuit 6103, which are connected to the bases of transistors 7252 and 7255, help prevent saturation of the transistors 7251 and 7277.

In operation, transistors 7252 and 7255 of the first output circuit 6104 in FIG. 7 convert the differential voltage applied to their respective bases to an output current which flows through load resistor 112 and produces a single ended output voltage VOUT1 at terminal 6116. In the event the voltages at the bases of transistors 7252 and 7255 are balanced (i.e., the same) the drain current through load transistor 7245 is the same as the collector current of n-p-n transistor 7252. As a result, no current flows through resistor 6112 and the voltage VOUT1 at terminal 6116 is the same as the voltage at terminal 6145, i.e., VDD/2. A differential voltage appearing between the bases of n-p-n transistors 7252 and 7255 causes a net current flow through resistor 6112. A non-zero output voltage VOUT1 then appears at terminal 6116 relative to the AC ground at terminal 6145. As is well known in the art, feedback element 6150 sets the gain and assures gain stability of the operational amplifier of FIG. 7. In other applications, however, the feedback element is not used or stability may be assured by external feedback elements.

In the second output circuit 6106 of the amplifier shown in FIG. 7, the base of transistor 7272 is connected to the drain of transistor 7230 and the base of transistor 7275 is connected to the drain of transistor 7225. In this way, the differential output signal from input circuit transistors 7225 and 7230 is applied to the second output circuit 6106. The emitters of n-p-n transistors 7272 and 7275 are connected together and to a bias arrangement provided at terminal 7316. The bias arrangement comprises series connected collector emitter path of n-p-n transistor 7277 and resistor 7280 connected between terminal 7314 and Vss (DC ground). The base of n-p-n transistor 7277 is connected to the base of transistor 7285 in the variable bias circuit 6110 of FIG. 7. Consequently, the current through the collector-emitter path of n-p-n transistor 7277 is controlled by adjustable voltage VC at terminal 6120. The gain of the second output circuit is thereby rendered adjustable responsive to control voltage VC.

The load circuit for transistors 7272 and 7275 includes current mirror connected transistors 7265 and 7269 whose drains receive fixed DC voltage Vdd and load resistor 6114 connected between voltage Vdd/2 carrying terminal 6145 and the collector of transistor 7272. Transistor 7272 has its collector connected to the drain of transistor 7265 as well as to resistor 6114 while the transistor 7275 has its collector connected to the drain and gate of transistor 7269 and to the gate of transistor 7265.

The operation of the second output circuit 6106 of the amplifier 700 in FIG. 7 is similar to that described with respect to the first output circuit 6104. Transistors 7272 and 7275 of the second output circuit portion in FIG. 7 convert the differential voltage applied between their respective bases to an output current which flows through load resistor 6114 and provides an output signal VOUT2 at terminal 6118. In the event the voltages at the bases of transistors 7272 and 7275 are balanced, the drain current of load transistor 7265 is equal to the collector current of transistor 7272. Consequently, no current flows through resistor 6114 and the voltage VOUT2 at terminal 6118 is equal to the voltage at terminal 6145, i.e., VDD/2. A differential voltage appearing between the bases of transistors 7272 and 7275 causes a net output current to flow through resistor 6114. A non-zero output voltage VOUT2 then appears at terminal 6118.

The adjustable (variable) voltage VC in the circuit 700 of FIG. 7 is received by the adjustable bias source 6110 and may be continuously adjustable in response to an external operating parameter. The adjustable voltage VC causes the voltage applied to the base of transistor 7277 in second output circuit 6106 to vary so that the gain of the second output circuit 6106 changes in accordance with the value of control voltage VC. The emitter bias current provided by transistor 7277 is varied from a minimum of zero to a maximum equal to the collector current in bias transistor 7251 of the amplifier first output circuit 6104 in FIG. 7. As a result, the gain of the second output circuit 6106 in which emitter coupled transistors 7272 and 7275 are controlled by n-p-n bias transistor 7277 is adjustable between zero and the preset gain of the first output circuit 6104 controlled by bias transistor 7251.

In an illustrative embodiment of amplifier 700 of FIG. 7, Vdd = +8 volts, Vdd/2 = +4 volts, Vss = zero volts and resistors 6112, 6114, 6150, 7204, 7209, 7260, 7280, 7281, 7289 and 7290 are 50K, 50K, 100K, 36K, 1.8K, 450, 450, 1.8K, 36K, and 1.8K ohms, respectively.

Figure 4:
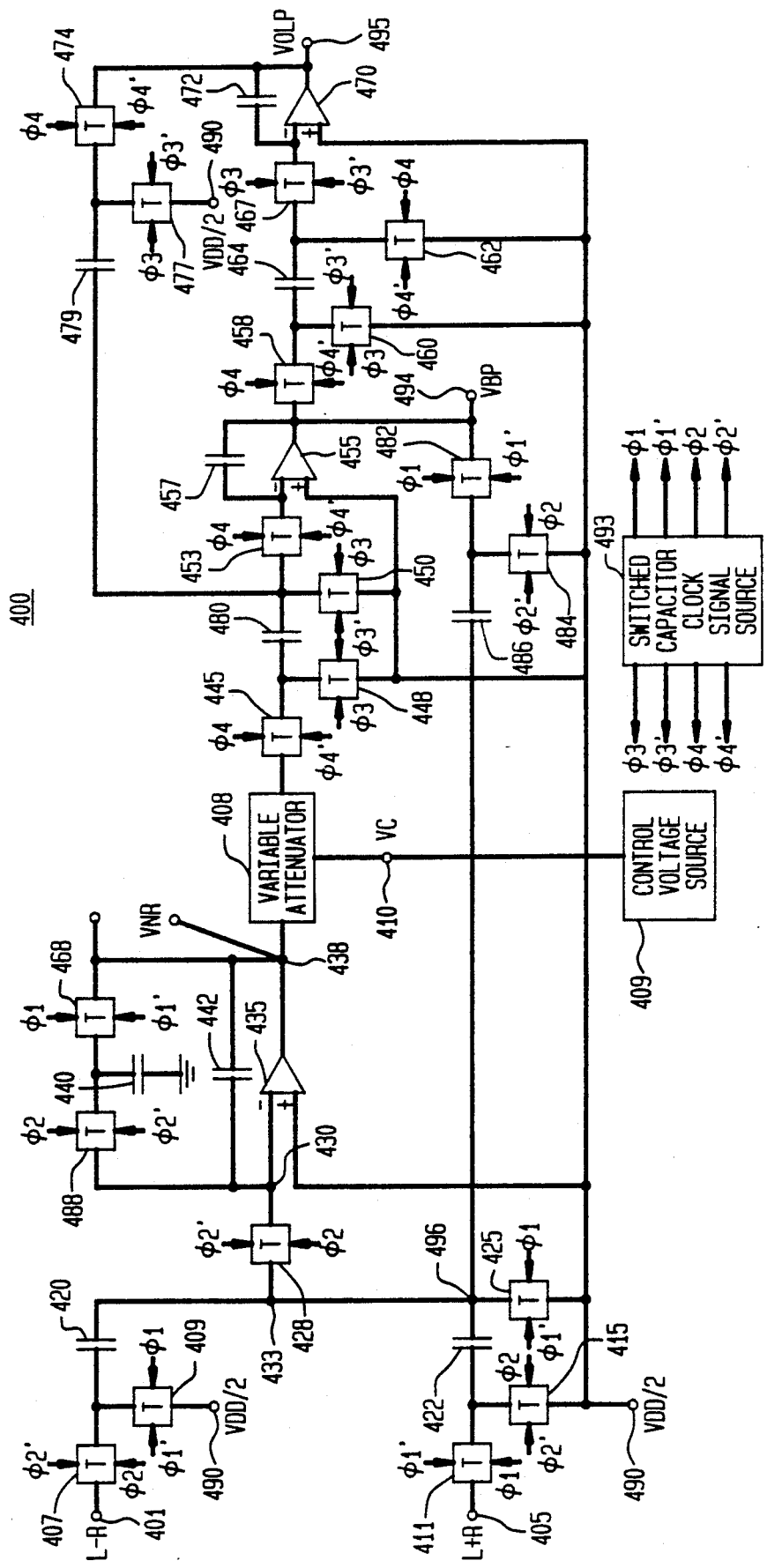
FIG. 4 is a schematic diagram of a switched capacitor notch filter in accordance with another embodiment of the present invention.

Referring now to FIG. 4, there is shown a schematic diagram of a switched capacitor notch filter 400 in accordance with the present invention. The filter 400 comprises a pair of input terminals 401 and 405 for receiving an L−R signal and an L+R signal from an AM stereo receiver; a supply terminal 490 having a DC voltage VDD/2 applied thereat; a switched capacitor matrix circuit comprising transmission gates 407, 409, 411, 415, 425 and 428 and capacitors 420 and 422; a summing type operational amplifier circuit comprising operational amplifier 435, transmission gates 468 and 488, a capacitor 440, and a feed back capacitor 442; an externally controlled variable attenuator 408; a first switched capacitor coupling network comprising transmission gates 445, 448, 450, and 453 and a capacitor 480; a first integrator comprising an operational amplifier 455 and a feed back capacitor 457; a second switched capacitor coupling network comprising transmission gates 458, 460, 462 and 467 and a capacitor 464; a second integrator comprising operational amplifier 470 and feedback capacitor 472; a switched capacitor feedback coupling network comprising transmission gates 474 and 477 and a capacitor 479; a second capacitor feedback to operational amplifier 435 comprising transmission gates 482 and 484 and a capacitor 486; a bandpass output 494; a low pass output terminal 495; and a switched capacitor clock signal source 493. The filter 400 receives signals L−R and L+R at terminals 401 and 405, respectively, and operates to form a RIGHT channel signal minus a notch at 10 kHz (VNR) that appears on a terminal 438 coupled to the output of operational amplifier 435. A similar arrangement may be used to form a LEFT channel signal.

Switched capacitor clock signal source 493 generates at output terminals thereof clocks signals ∅1, ∅1', ∅2, ∅2', ∅3, ∅3', ∅4 and ∅4' which are distributed within the filter 400 to control gates of the various transmission gates. Source 493 can be formed from a variety of circuits known in the art.

In filter 400, clock signals ∅1 and ∅2 are used by transmission gates 407, 409, 411, 415, 425, 428, 468, 482, 488 and 484 in the matrix and summing amplifier sections of the filter 400. Clock signals ∅1 and ∅2 are non-overlapping square wave signals having a repetition rate of 45 kHz. Clock signals ∅3 and ∅4 are used by transmission gates 445, 448, 450, 453, 460, 462, 467, 474 and 477 employed in the first integrator comprising operational amplifier 455 and the second integrator comprising operational amplifier 470. Clock signals ∅3 and ∅4 are at 225 kHz which is an integral multiple of the 45 kHz ∅1 and ∅2 clock signal frequency.

The signal L−R applied to the terminal 401 is transferred to a terminal 433 by switched capacitor network including ∅1 clocked transmission gates 409 and 425, ∅2 clocked transmission gate 407 and the capacitor 420, while signal L+R is coupled to a terminal 433 through the switched capacitor network including ∅1 clocked transmission gates 411 and 425, the ∅2 clocked transmission gate 415 and the capacitor 422. The resulting signal at terminal 433, i.e. the difference between signals L−R and L+R, corresponds to the RIGHT channel signal. The terminal 433 also receives the inverse of the notch bandpass signal formed by the switched capacitor arrangement of capacitor 486 and ∅1 clocked transmission gates 482 and 425 and ∅2 clocked transmission gate 484. The RIGHT channel minus the 10 kHz bandpass signals from terminal 433 is transferred to the negative input of operational amplifier 435 at terminal 430 through ∅2 clocked transmission gate 428. The combined RIGHT channel and the inverse 10 kHz bandpass signal is further combined at terminal 430 with the feedback signals from the switched capacitor circuit including ∅1 clocked transmission gate 468, ∅2 clocked transmission gate 488 and capacitor 440 and feedback capacitor 442.

The signal at an output terminal 438 of operational amplifier 435 is an amplified version of the RIGHT channel signal minus the notch created by subtraction of the 10 kHz bandpass signal (9 kHz in the case of European receivers). The Q of the bandpass section of the filter 400 comprising the ∅1 clocked transmission gates 482 and 425 and the ∅2 clocked transmission gate 484, is controlled by the effective resistance of the switched capacitor coupling network between the output of amplifier 435 and the input of the first integrator amplifier 455. The switched capacitor coupling network comprises the ∅3 clocked transmission gates 448 and 450 and the ∅4 clocked transmission gates 445 and 453 and the capacitor 480. As described with respect to switched capacitor low pass filter 300 of FIG. 3, the effective resistance of this switched capacitor coupling network is controlled by adjusting the loss of attenuator 408 in accordance with the DC control voltage VC applied to terminal 410.

Variable attenuator 408 can be any continuously adjustable voltage controlled attenuator as in low pass filter 300 of FIG. 3. In the preferred embodiment of our invention, however, operational amplifier 435 and attenuator 408 together comprise the dual output amplifier shown and described with respect to FIGS. 6 and 7. When control voltage VC at terminal 410 is at its highest value, e.g., 4 volts, the Q of the band pass filter section of the switched capacitor filter 400 of FIG. 4 is at its maximum. If voltage VC decreases to 0.5 volts or less, the Q of the band pass section is reduced to its minimum value. The center frequency of the notch e.g., 10 kHz does not change over 0.5 to 4 volt range of control voltage VC.

The first integrator operational amplifier 455 receives one signal from switched capacitor 480 and another signal from switched capacitor 479 through transmission gate 453 and is adapted by its feedback capacitor 457 to provide at a terminal 494 a bandpass voltage signal VBP. The signal VBP may be used for control purposes. The effective resistance of switched capacitor 480 and associated transmission gates 445, 448, 450 and 453 determined by voltage controlled attenuator 408 controls the bandwidth and shape of bandpass signal VBP. Second integrator operational amplifier 470 receives the bandpass signal VBP through the switched capacitor coupler comprising a capacitor 464 and transmission gates 458, 460, 462, and 467 and a signal through its feedback capacitor 472. The coupling and feedback arrangements between operational amplifiers 455 and 470 determine the center frequency of the switched capacitor notch filter 400 which remains invariant and the voltage controlled attenuator 408 permits variation of the Q of the filter characteristics. Operational amplifiers 455 and 470 may be replaced by a variable attenuator arrangement such as employed in the attenuator 408 so that the parameters of the filter circuit 400 determined by the effective resistances of the switched capacitor arrangements including capacitor 464 or 479 may be varied in accordance with an external control voltage from a source such as control voltage source 409.

It is to be understood that the specific embodiments described herein are intended to be illustrative of the spirit and scope of the invention. Modifications can readily be made by those skilled in the art consistent with the principles of this invention. While a biquadratic filter with varying parameters has been described, the invention may be used in various other filter configurations.

The embodiments of the invention in which an exclusive property or privilege is claimed are defined as follows:

1. A switched capacitor filter circuit comprising:
   means for receiving one or more input signals;
   means for amplifying the one or more input signals having an input connected to the receiving means and an output;
   integrating means having an input and an output, and
   means for coupling the output of the amplifying means to the input of the integrating means comprising;
   a switched capacitor coupler exhibiting a prescribed effective resistance and having an input, and an output connected to the input of the integrating means; and
   means coupled between the output of the amplifying means and the input of the switched capacitor coupler for varying the magnitude of the amplified one or more input signals to determine the exhibited effective resistance of the switched capacitor coupler.

2. The switched capacitor filter circuit of claim 1 wherein the amplified one or more input signals varying means comprises:
   control means; and
   means responsive to the control means for altering the magnitude of the amplified one or more input signals.

3. The switched capacitor filter circuit of claim 2 wherein the integrating means comprises filter means responsive to the amplified one or more input signals from the switched capacitor coupler for forming a signal having a predetermined bandwidth.

4. The switched capacitor filter circuit of claim 3 wherein the signal formed in the filtering means responsive to the amplified one or more input signals from the switched capacitor coupler is a low pass filtered version of the amplified one or more input signals.

5. The switched capacitor filter circuit of claim 3 wherein the signal formed in the filtering means responsive to the amplified one or more input signals from the switched capacitor coupler is a filtered version of the amplified one or more input signals having a prescribed pass band.

6. The switched capacitor filter circuit of claim 2 further comprising a second switched capacitor coupler for coupling the output of the integrating means to the amplifying means input.

7. A switched capacitor filter circuit comprising:
   means for receiving a plurality of input signals;
   means for summing the plurality of input signals having an input connected to the receiving means and an output;
   integrating means having an input and an output; and
   means for coupling the output of the summing means to the input of the integrating means comprising:
   a switched capacitor coupler exhibiting an effective resistance and having an input, and an output connected to the input of the integrating means; and
   means connected between the output of the summing means and the input of the switched capacitor coupler for varying the magnitude of the summed input signals to control the effective resistance exhibited by the switched capacitor coupler.

8. A switched capacitor filter circuit comprising:
   a first filter circuit having a plurality of inputs for receiving a plurality of input signals and an output;
   summing circuit means for summing the plurality of input signals comprising a first input terminal coupled to said first filter output, an output terminal, and signal summing means for coupling said input terminal to said output terminal;
   a second filter circuit comprising an input terminal, an output terminal, and filtering means for coupling the second filter circuit input terminal to the second filter circuit output terminal;
   means providing a control signal;
   attenuator means comprising an attenuator input terminal coupled to said output terminal of said summing means, an attenuator output terminal, an attenuator control terminal, and adjustable attenuation means responsive to said control signal applied to said control terminal for coupling said attenuator input terminal to said attenuator output terminal; and switched capacitor means for coupling said attenuator output terminal to said second filter circuit input terminal.

9. The switched capacitor filter of claim 8 wherein the filtering means of the second filter circuit is a low pass filter.

10. The switched capacitor filter of claim 8 wherein the filtering means of the second filter circuit is a notch filter having a prescribed center frequency.

11. The switched capacitor filter circuit of claim 8 wherein the adjustable attenuation means is continuously adjustable.

12. The switched capacitor filter circuit of claim 8 wherein the summing means further comprises:
an additional input terminal; and
the output terminal of the second filter circuit is connected to the additional input terminal of the summing means.

13. A switched capacitor filter circuit comprising:
input and summing circuit means for receiving an input signal;
integrator circuit means having an input and an output;
a switched capacitor coupler means exhibiting a prescribed effective resistance and having an input, and an output connected to the input of the integrator means; and
switched capacitor feedback circuit means connected in a feedback circuit between the output of said integrator circuit means and said input and summing circuit means;

variable attenuator means coupled between the output of said input and summing circuit means and the input of the switched capacitor coupler means for varying the magnitude of the output of said input and summing circuit means to determine the exhibited effective resistance of the switched capacitor coupler.

14. The switched capacitor filter circuit of claim 13 wherein the variable attenuator means is continuously variable.

15. The switched capacitor filter circuit of claim 13 wherein the integrator means comprises:
a plurality of elements for determining prescribed parameters to shape the input signal; and
the integrator means being responsive to the exhibited effective resistance of the switched capacitor coupler for altering the prescribed parameters.

16. A switched capacitor circuit comprising:
means for receiving an input signal;
means for summing said input signal with a feedback signal;
a switched capacitor coupler exhibiting a prescribed effective resistance and having an input and an output; and
attenuator means coupled between the output of said summing means and the input of the switched capacitor coupler for varying the magnitude of the output of said summing means to determine the exhibited effective resistance of the switched capacitor coupler;
integrator means responsive to the output of said switched capacitor coupler and providing a circuit output;
feedback means coupling said circuit output to said summing means.

17. The switched capacitor circuit of claim 16 wherein said attenuator means is continuously variable.

* * * * *